United States Patent [19]
Rydeski

[11] 3,717,797
[45] Feb. 20, 1973

[54] ONE PIECE ALUMINUM ELECTRICAL CONTACT MEMBER FOR SEMICONDUCTOR DEVICES

[75] Inventor: Julian A. Rydeski, Oakmont, Pa.

[73] Assignee: Westinghouse Electric Corporation, Pittsburgh, Pa.

[22] Filed: March 19, 1971

[21] Appl. No.: 126,189

[52] U.S. Cl. .........317/234 R, 317/234 M, 317/234 P
[51] Int. Cl. ..............................H01l 3/00, H01l 5/00
[58] Field of Search........317/234 L, 234 M, 234 N, 234 P, 317/234, 29/586, 587, 589

[56] References Cited

UNITED STATES PATENTS 3,170,098 2/1965 Marino ............................317/234 D
3,292,056 12/1966 Emeis et al. ........................317/234 P
3,396,316 8/1968 Wislocky ............................317/234 P
3,476,986 11/1969 Tsuji ...............................317/234 P

*Primary Examiner*—John W. Huckert
*Assistant Examiner*—Andrew J. James
*Attorney*—A. T. Stratton and C. L. Menzemer

[57] ABSTRACT

A solid one piece electrical contact member is resiliently held in direct physical, electrical, and thermal conductive contact with an electrode affixed to a surface of a body of semiconductor material.

5 Claims, 1 Drawing Figure

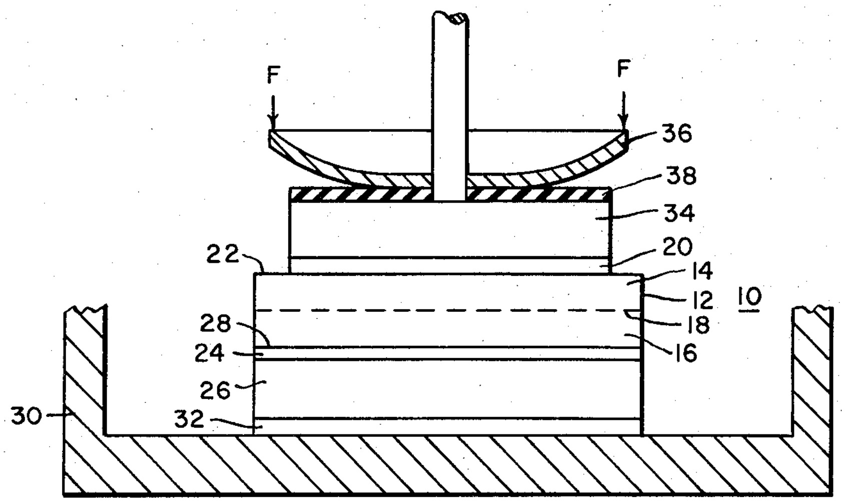
F
F
36
38
34
20
22
14
12
10
18
28
24
16
26
30
32

ONE PIECE ALUMINUM ELECTRICAL CONTACT MEMBER FOR SEMICONDUCTOR DEVICES

BACKGROUND OF INVENTION

1. Field of the Invention

This invention is in the field of semiconductor devices and is particularly concerned with a means of making electrical contact to a body of semiconductor material.

2. Prior Art

It is common prior art practice in making electrical contact to a semiconductor device to employ an electrical contact member comprised of a composite of metal layers soldered or brazed together. The layers usually consist of different metals.

The two or more solder or braze joints between the metal layers increase the electrical resistance of the contact to a current flowing through the contact with a resultant increase in thermal impedance.

The increased thermal impedance inturn has an undesirable effect on the electrical parameters of the semiconductor device.

SUMMARY OF THE INVENTION

In accordance with the teachings of this invention there is provided a semiconductor device comprising, a body of semiconductor, an electrode affixed to a surface of said body, and solid one piece electrical contact held in physical, electrical and thermal conductive contact with the electrode by compressive means. The electrical contact consists of aluminum.

DESCRIPTION OF THE DRAWINGS

The sole FIGURE of the drawing is a side view, partly in cross section, of a portion of a semiconductor device, made in accordance with the teachings of this invention.

DESCRIPTION OF PREFERRED EMBODIMENT

With reference to FIG. 1, there is shown, partially in cross section, a semiconductor device 10 embodying the teachings of this invention.

The device 10 is comprised of a body of semiconductor material 12, preferably silicon, having a region 14 and a region 16 of opposite type semiconductivity with a p-n junction 18 therebetween.

An electrode 20 is affixed to major surface 22 of the body 10. The electrode 20 consists of aluminum.

A layer 24 of a hard solder, as for example a silver-lead-antimony solder, is employed to join a second electrode 26 to the other major surface 28 of the body 10.

The second electrode 26 consists of a metal selected from the group consisting of molybdenum, tungsten, tantalum and base alloys thereof.

The second electrode 26 is in turn held in an electrical and thermal conductive relationship with a case member 30 through a layer 32.

The layer 32 may be a hard solder in which case the electrode 32 is soldered to the case member 30. In the alternative, layer 32 may be a layer of a malleable, electrically and thermally conductive metal selected from the group consisting of gold, silver, tin and aluminum and base alloys thereof, in which case the electrode 32 is held in electrical and thermal contact with case member 30 by a compressive force as is explained hereinafter.

A solid one piece aluminum electrical contact 34 is in an electrical and thermally conductive relationship with aluminum electrode 20.

The aluminum contact 34 is held in electrical and thermal contact with the aluminum electrode 20 by a compressive force F generated by a suitable means, such for example as a Belleville washer 36. The compressive force F acts on the aluminum electrical contact 34 through an electrically insulating apertured washer-like member 38.

If the electrode 26 is not soldered to case member 30 it is also held in electrical and thermal contact with the case 30 by the compressive force F.

The employment of the aluminum electrical contact member 34 eliminates the detrimental effects of high electrical contact resistance as well as high thermal impedances encountered when using prior art contact members embodying a sandwich type structure. A typical prior art contact member comprises a cylindrical copper stem member having an outwardly extending flange portion integral therewith or a copper washer-like member affixed thereto at one end by suitable brazing means. Affixed to the flange portion, or to the washer-like member, whatever the case may be, is a second washer-like member or disc of a material which has a coefficient of thermal expansion closely matched to that of the material comprising the body 12 of semiconductor material. Such suitable materials are molybdenum, tungsten, tantalum, and base alloys thereof jointed by a suitable solder layer to the flanged portion or the washer-like member. A layer of gold or silver is disposed on the face of the second washer-like member or disc in physical contact with the electrical contact 20 or with a further cushioning electrical contact assembly disposed therebetween the two components and in physical contact therewith.

Each of these metals employed has a different co-efficient of thermal conductivity. Additionally, it has been found that each of the solder joints always has voids therein and consequently the contact electrical resistance is increased and the thermal impedance of the assembly is increased with each solder layer encountered. Where intermediate cushioning electrical contact assemblies are employed, two or more interfaces are encountered where electrical and thermal conductivity is achieved through a plurality of physical point contact relationship thereby further increasing the electrical contact resistance and thermal impedance problems of the electrical device. Consequently, the device in operation generates additional heat to be dissipated, thereby decreasing the electrical efficiency of the device since it is waste heat. The additional heat to be dissipated cannot be efficiently reversed because of the increased thermal impedance encountered and consequently a further decrease in the efficiency of the electrical parameters of the device results.

The aluminum contact 34 of this invention eliminates these problems. The direct physical contact of contact 34 with electrode 20 achieves a good electrical and thermal conducting relationship with one another. In particular, the mating of like materials achieves the best electrical and thermal conductivity possible. This is achieved by having the same metals, aluminum, in physical contact with each other during electrical and thermal cycling of the device which results in negligible electrical and thermal resistance between the abutting contact surfaces. The net result is that the electrical device of this invention has a good electrical contact relationship between components, better thermal conductivity relationship between the components and less waste heat to be dissipated because of the resulting lowering of total electrical contact resistance and thermal impedances within the device when compared to prior art devices of the same basic designs.

Whereas prior art devices after encapsulation show no change or an increase in the forward voltage, $V_F$, of the devices, devices embodying the aluminum contact 34 continually show a significant decrease of a minimum of 5 percent in the forward voltage drop when tested in accordance with the standard electrical industry requirement of a 500 ampere pulse. This forward voltage drop parameter or forward voltage drop characteristic is important since design circuitry is dependent on the stability of the device. Further evaluation of devices embodying the aluminum contact 34 under test conditions such, for example, as forward blocking voltage under no bias condition, reverse blocking voltage under no bias condition, applicable gate current and voltage for the design parameters, forward voltage drop at 50 amperes and 500 amperes pulse, and blocking life test for 96 hours at 125° C, show the devices of this invention to be equal to, or better than, prior art devices. All devices made in accordance with the teachings of this invention were subjected to surge current tests at the primary conditions of 76 + 4° C at a $I_{AVE}$ of 80 amperes (180° sine), and then subjected to specific current surges for ½ cycle at 1600 amperes, 3 cycles at 1250 amperes, and 10 cycles at 1080 amperes, each unit being subjected to 5 consecutive surges for each cycle indicated for a total of 15 surges wherein a three second delay period between surges was used to control the temperature of the device within specifications, and the devices proved superior to the prior art devices. Further tests involving a 1000 hour operating life test at 70 amperes and 600 volts at a temperature of 85° C immediately followed by a thermal shock test comprising heating the devices to a temperature of 125° C and cooling them to 5° C in cold running water again showed the devices made in accordance with this invention to be equal to or superior to the prior art devices of the same design.

All electrical devices made in accordance with the teachings of this invention were then encapsulated. After encapsulation, each device was evaculated under partial vacuum conditions and back-filled with a mixture of nitrogen and helium gases prior to seal welding the devices. Each of the devices was stored for one week at 200° C followed by a further one week storage at 250° C. Each device was then subjected to a 1000 hour operating life test at 70 amperes and 600 volts at a temperature of 85° C followed by a thermal shock test of cooling each device from 125° C to 5° C in cold running water. All devices when evaluated for the voltage drop at 50 amperes and 500 amperes surge conditions, were found to be the same as, or better than, the results obtained prior to testing. One device was then sectioned to evaluate the device for corrosion. A visual check showed that the use of the aluminum contact member 12 did not present any corrosion problems.

While the teachings of this invention have been described in conjunction with a diode, it will be understood that the invention is equally applicable to transistors and solid state AC and DC switches.

I claim as my invention:

1. A semiconductor device comprising a body of semiconductor material, said body having at least one region of a first-type of semiconductivity and at least one region of a second-type of semiconductivity with a p-n junction therebetween, an aluminum electrode affixed on a first major surface of said body and in electrical and thermal contact with one of said regions, an aluminum electrical contact disposed on said aluminum electrode, and means for exerting a compressive force upon said aluminum contact whereby it is held in a direct physical electrical and thermally conductive relationship with said aluminum electrode.

2. The device of claim 1 wherein an electrically insulating member is disposed between said aluminum electrical contact and said compressive force means.

3. The device of claim 2 in which a second metal electrode is affixed to a second major surface of said body, said second electrode being in an electrically conductive relationship with another of said regions, said second major surface being parallel to said first major surface.

4. The device of claim 3 in which said second metal electrode is soldered to a case member.

5. The device of claim 3 in which said second metal electrode is held in an electrically and thermally conductive relationship with said case member by said force means and a layer of a malleable layer is disposed between said second electrode and said case member.

* * * * *